| United States Patent [19] | [11] Patent Number: 4,996,132 |
|---|---|
| Tazawa et al. | [45] Date of Patent: Feb. 26, 1991 |

[54] HEAT-RESISTANT PHOTOSENSITIVE RESIN COMPOSITION

[75] Inventors: Kenji Tazawa; Akira Iwata; Tomoki Horigome; Hiroyuki Tohda, all of Kanagawa, Japan

[73] Assignee: Toyko Ohka Kogyo Co. Ltd., Kanagawa, Japan

[21] Appl. No.: 159,622

[22] Filed: Feb. 23, 1988

[30] Foreign Application Priority Data

Feb. 25, 1987 [JP] Japan .................................. 62-40140
Sep. 30, 1987 [JP] Japan ................................ 62-243674

[51] Int. Cl.⁵ .............................................. G03F 7/031
[52] U.S. Cl. ................................. 430/286; 430/287; 430/288; 430/280; 430/281; 522/102; 522/103; 522/110; 522/112; 522/46; 522/48
[58] Field of Search ............... 430/280, 281, 283, 288, 430/286, 287; 522/102, 103, 110, 112, 46, 48

[56] References Cited

U.S. PATENT DOCUMENTS

| 4,025,348 | 5/1979 | Tsukada et al. |  |
|---|---|---|---|
| 4,040,925 | 8/1977 | McGinniss | 522/9 |
| 4,049,894 | 9/1977 | Backderf | 526/62 |
| 4,390,615 | 6/1983 | Courtney et al. |  |
| 4,525,499 | 6/1985 | Hayashi | 523/523 |
| 4,670,485 | 6/1987 | Hesse et al. | 525/64 |
| 4,688,054 | 8/1987 | Inamoto et al. | 522/102 |
| 4,725,524 | 2/1988 | Elzer | 430/258 |
| 4,789,620 | 12/1988 | Sasaki et al. | 430/280 |

FOREIGN PATENT DOCUMENTS

206086 12/1986 European Pat. Off. .
207188 7/1987 European Pat. Off. .

*Primary Examiner*—Marion C. McCamish
*Assistant Examiner*—Christopher D. RoDee
*Attorney, Agent, or Firm*—Pennie & Edmonds

[57] ABSTRACT

The photosensitive resin composition comprises (a) a ternary copolymer of an ethylenically unsaturated amide, carboxyl-containing monomer and third monomer, (b) an esterified resin by the reaction of an unsaturated carboxylic acid and a novolactype epoxy resin, (c) a photopolymerizable monomer, (d) a photopolymerization initiator and (e) a powder such as a finely divided silica filler. The resist layer formed from the composition is capable of being developed with an alkaline aqueous solution and has excellent heat resistance in addition to other desirable properties when the patterned resist layer by the pattern-wise exposure to ultraviolet light and development is subjected to a heat treatment to effect thermal curing.

21 Claims, No Drawings

HEAT-RESISTANT PHOTOSENSITIVE RESIN COMPOSITION

BACKGROUND OF THE INVENTION

The present invention relates to a photosensitive resin composition or, more particularly, to a heat-resistant photosensitive resin composition suitable for use in the manufacture of printed circuit boards having excellent heat resistance, adhesion and high photosensitivity to satisfy the requirements for a solder resist, etching resist and plating resist.

It is well known in the prior art to use a photosensitive resin as a solder resist, etching resist or plating resist in the manufacturing process of printed circuit boards. Various kinds of photosensitive resins or photosensitive resin compositions have been proposed hitherto and are practically used for the purpose.

For example, the solder resist disclosed in Japanese Patent Kokai No. 60-208377 comprises a phenol novolac-type or cresol novolac-type epoxy resin having an ethylenically unsaturated group, a photopolymerization initiator and an amine-based curing agent. The heat-resistant photosensitive resin composition disclosed in Japanese Patent Kokai No. 58-199341 comprises a diallyl phthalate prepolymer, a photopolymerizable monomer and a photopolymerization initiator. Further, the photopolymerizable resin composition disclosed in Japanese Patent Publication No. 52-43090 comprises a linear polymeric compound having an N-alkoxymethyl carbamoyl group as the pendant group and a compound having at least two epoxy groups in a molecule.

These heat-resistant photosensitive resin compositions are advantageous in respect of the excellent resistance against heat and chemicals but, in contrast therewith, have a defect that the developer for the development treatment thereof is limited to some special organic solvents such as chlorinated hydrocarbon solvents to cause an economical disadvantage due to the expensiveness of the organic solvents used as the developer.

Besides, it is a trend in recent years to minimize the amount of use of chlorinated hydrocarbon solvents from the standpoint of decreasing the problems of environmental pollution and workers' health so that the number of the organic solvents usable as a developer in the development treatment of these heat-resistant photosensitive resin compositions is decreased less and less.

With an object to solve the above described problems, development works have been undertaken to obtain a heat-resistant photosensitive resin composition capable of being developed with water or an aqueous alkaline solution as the developer although no practically satisfactory photosensitive resin composition has yet been obtained due to the poor resistance against heat and chemicals as well as in respect of the poor adhesion to the substrate surface and stability in storage.

SUMMARY OF THE INVENTION

The present invention accordingly has an object to provide a novel and improved photosensitive resin composition capable of being developed with an aqueous alkaline solution as the developer and giving a photosensitive resinous layer with excellent resistance against heat and chemicals as well as good adhesion to the substrate surface and high electric insulation.

Thus, the heat-resistant photosensitive resin composition developed as a result of the extensive investigations undertaken with the above mentioned object comprises:

(a) a copolymer obtained by the copolymerization of a monomer mixture comprising from 10 to 30% by weight of an unsaturated amide compound represented by the general formula $$CH_2=CX-CO-NH-Y-OZ, \qquad (I)$$

in which X is a hydrogen atom or a methyl group, Y is an alkylene group having 1 to 4 carbon atoms and Z is an alkyl group having 1 to 4 carbon atoms or a benzyl group as a first essential monomer and from 10 to 30% by weight of an ethylenically unsaturated compound having at least one carboxyl group in a molecule as a second essential monomer;

(b) an esterified resin which is a reaction product of a novolac-type epoxy resin and an ethylenically unsaturated carboxylic acid in an amount of 0.8 to 1.1 equivalents relative to the epoxy groups in the novolac-type epoxy resin;

(c) a photopolymerizable monomer;

(d) a photopolymerization initiator; and (e) a solid powder as a filler.

DETAILED DESCRIPTION OF THE PREFERRED EMBODIMENTS

As is understood from the above given summary of the invention, the inventive photosensitive resin composition comprises two different types of resinous ingredients of which one is thermocurable and the other is photopolymerizable as the components (a) and (b), respectively The component (a) in the inventive resin composition is a heat-curable polymer which is a copolymer of three different types of comonomers. The first of the comonomers is an ethylenically unsaturated amide compound represented by the above given general formula (I), in which X is a hydrogen atom or a methyl group, Y is an alkylene group having 1 to 4 carbon atoms and Z is an alkyl group having 1 to 4 carbon atoms or a benzyl group.

Exemplary of such an ethylenically unsaturated amide compound are N-methoxymethyl acrylamide, N-methoxymethyl methacrylamide, N-ethoxymethyl acrylamide, N-ethoxymethyl methacrylamide, N-propoxymethyl acrylamide, N-propoxymethyl methacrylamide, N-n-butoxymethyl acrylamide, N-n-butoxymethyl methacrylamide, N-isobutoxymethyl acrylamide, N-isobutoxymethyl methacrylamide, N-benzyloxymethyl acrylamide, N-benzyloxymethyl methacrylamide, N-n-butoxyethyl acrylamide, N-n-butoxyethyl methacrylamide, N-isobutoxyethyl acrylamide, N-isobutoxy methacrylamide and the like.

These unsaturated amide compounds can be used either singly or as a combination of two kinds or more according to need. The amount of this first monomer in the monomer mixture to be copolymerized should be in the range from 10 to 30% by weight. When the amount of the first monomer is too large in the monomer mixture, some decrease is noted in the alkali-developability of the photosensitive resin composition formulated with the copolymer obtained from such a monomer mixture. When the amount of the first monomer is too small in the monomer mixture, the heat resistance of the photosensitive resin composition is somewhat decreased.

The second monomer in the monomer mixture for the preparation of the copolymer as the component (a) is an ethylenically unsaturated compound having at least one carboxyl group in a molecule which is typically exemplified by acrylic and methacrylic acids though not limited thereto These carboxyl-containing monomers can be used either singly or as a combination of two kinds or more according to need.

The amount of the second monomer in the monomer mixture should be in the range from 10 to 30% by weight. When the amount thereof is too small, the developability of the photosensitive resin composition is somewhat decreased so that no satisfactory patterning can be obtained in the layer of the photosensitive resin composition. When the amount of the second monomer is too large in the monomer mixture, on the other hand, the storage stability of the photosensitive resin composition formulated with the copolymer is decreased to eventually cause gelation in addition to the decrease in the electric insulation of the layer of the resin composition.

The copolymer as the component (a) in the inventive photosensitive resin composition is a ternary copolymer prepared from a monomer mixture composed of the above described first and second monomers and a third monomer which is an ethylenically unsaturated compound and capable of being copolymerized with the first and second monomers. Such a monomeric compound is exemplified by styrene, γ-methyl styrene, methyl acrylate, methyl methacrylate, butyl acrylate, butyl methacrylate, hydroxymethyl acrylate, hydroxymethyl methacrylate, hydroxypropyl acrylate, hydroxypropyl methacrylate and the like though not limited thereto. These monomers can be used either singly or as a combination of two kinds or more according to need.

The amount of the third monomer in the monomer mixture should be in the range from 40 to 80% by weight. When the amount thereof in the monomer mixture is too large, the developability of the photosensitive resin composition with an aqueous alkaline solution is somewhat decreased along with decrease in the heat resistance of the composition. When the amount thereof is too small in the monomer mixture, the storage stability of the photosensitive resin composition is undesirably decreased.

The above described copolymer as the component (a) in the inventive photosensitive resin composition is effective for increasing the heat resistance of the patterned photoresist layer because the copolymer forms crosslinks by a heat treatment following the process of patterning by exposure to light and development with a developer liquid.

The component (b) in the inventive photosensitive resin composition is a photopolymerizable esterified resin which is a reaction product of a novolac-type epoxy resin and an ethylenically unsaturated carboxylic acid. Suitable novolac-type epoxy resins include phenol novolac-type epoxy resins and cresol novolac-type epoxy resins and they can be used either singly or as a mixture of two kinds or more according to need. The novolac-type epoxy resin can be prepared by the reaction of epichlorohydrin or methyl epichlorohydrin with a phenol novolac resin or a cresol novolac resin obtained from phenol or cresol and formaldehyde.

The ethylenically unsaturated carboxylic acid to be reacted with the above mentioned novolac-type epoxy resin is exemplified by acrylic acid, methacrylic acid, crotonic acid, maleic acid monomethyl ester, maleic acid monopropyl ester, maleic acid monobutyl ester, sorbic acid and the like. These unsaturated carboxylic acids can be used either singly or as a combination of two kinds or more according to need.

The esterification reaction of the above mentioned novolac-type epoxy resin and the ethylenically unsaturated carboxylic acid is performed in the presence of an esterification catalyst which may be any of conventionally used ones including secondary and tertiary amines and salts thereof such as diethyl amine hydrochloride, diethyl amine acetate, triethyl amine and the like.

The esterification reaction of the novolac-type epoxy resin and the ethylenically unsaturated carboxylic acid should be performed by using the acid in an amount of 0.8 to 1.1 equivalents relative to the epoxy groups in the epoxy resin in the presence of the above mentioned esterification catalyst. When the esterification reaction is properly undertaken, the resultant product is a heat-resistant polyfunctional esterified resin containing almost no unreacted epoxy groups and the resin can be polymerized by heating or by exposure to actinic rays such as ultraviolet.

In addition to the above described two resinous ingredients, i.e. components (a) and (b), the inventive photosensitive resin composition essentially comprises a photopolymerizable monomer as the component (c), which is exemplified by methyl acrylate, methyl methacrylate, 2-hydroxyethyl acrylate, 2-hydroxyethyl methacrylate, 2-hydroxypropyl acrylate, 2-hydroxypropyl methacrylate, 1,6-hexane diol diacrylate, trimethylol propane triacrylate, trimethylol propane trimethacrylate, trimethylol propane diacrylate, trimethylol propane dimethacrylate, tetramethylol methane tetraacrylate, tetramethylol methane tetramethacrylate, pentaerithritol triacrylate, pentaerithritol trimethacrylate, dipentaerithritol pentaacrylate, dipentaerithritol pentamethacrylate, 1,1,1-tri-(acryloxypropoxypropoxymethyl) propane of the formula $C_2H_5C[CH_2O(C_3H_6O)_2CO-CH=CH_2]_3$, melamine acrylates obtained by the reaction of hexamethylol melamine with at least an equimolar amount of a hydroxyalkyl acrylate or hydroxyalkyl methacrylate and carboxyl-containing esterified resins obtained by the reaction of an anhydride of a dibasic carboxylic acid with the hydroxy groups of the reaction product of a phenol novolac-type or cresol novolac-type epoxy resin with acrylic acid or methacrylic acid though not particularly limited thereto. Among the above named photopolymerizable monomers, the melamine acrylates or methacrylates obtained by the reaction of hexamethylol melamine and a hydroxyalkyl acrylate or hydroxyalkyl methacrylate are sometimes advantageous because the reaction product can be either one of the mono- to hexa(meth)acrylates by appropriately controlling the molar ratio of the reactants to give a possibility of wide selection of the monomer according to need.

The above mentioned melamine acrylate compounds can be obtained by first preparing hexamethoxymethyl melamine from melamine via hexamethylol melamine and then reacting the hexamethoxymethyl melamine with a hydroxyalkyl acrylate or hydroxyalkyl methacrylate such as hydroxyethyl acrylate, hydroxyethyl methacrylate, hydroxypropyl acrylate, hydroxypropyl methacrylate and the like. The advantage obtained by using these melamine acrylate compounds is that, when the melamine acrylate compound has been photopolymerized by the irradiation with ultraviolet light, the molecules of the photopolymerized polymer still may have methoxy groups having reactivity with the hydroxy groups in the above described copolymer as the component (a) or the esterified resin as the component (b) to serve as a crosslinking agent so that the inventive photosensitive resin composition can be imparted with further increased heat resistance.

The carboxyl-containing esterified resin, which is a reaction product of an anhydride of a dibasic carboxylic acid with the hydroxy groups of the reaction product of a phenol novolac-type or cresol novolac-type epoxy resin with acrylic or methacrylic acid, has carboxyl groups in the molecule so that it is highly soluble in an aqueous alkaline solution. Therefore, the inventive photosensitive resin composition formulated with such a carboxyl-containing esterified resin as the photopolymerizable monomer has an advantage of improved developability because the resin composition in the areas unexposed to light can easily be dissolved in the aqueous alkaline developer solution used in the development treatment. Exemplary of the anhydride of dibasic carboxylic acid used in the preparation of the carboxyl-containing esterified resin are succinic anhydride, maleic anhydride, phthalic anhydride and the like.

As to the blending ratio of the above described components (a), (b) and (c) in the inventive photosensitive resin composition, it is preferable that 100 parts by weight of the copolymer as the component (a) should be compounded with from 20 to 200 parts by weight of the esterified resin as the component (b) and from 25 to 200 parts by weight of the photopolymerizable monomer as the component (c).

The photopolymerization initiator as the component (d) in the inventive photosensitive resin composition may be any of conventionally used ones in the prior art photosensitive resin compositions. Exemplary of suitable photopolymerization initiators are benzophenone compounds such as benzophenone, 4,4'-dimethylamino benzophenone and 4,4'-diethylamino benzophenone, anthraquinone compounds such as 2-ethyl anthraquinone and tert-butyl anthraquinone, benzoin alkyl ethers such as benzoin ethyl ether and benzoin propyl ether, 2,2-dimethoxy- 2-phenyl acetophenone, 2,2-diethoxy acetophenone, 2-chlorothioxanthone, diethyl thioxanthone, 2-hydroxy-2-methyl propiophenone, 4'-isopropyl-2-hydroxy-2-methyl propiophenone, 2-methyl-1-[4-(methylthio)phenyl]-2-morpholino-1-propanone and the like. These compounds can be used either singly or as a combination of two kinds or more according to need. The amount of the photopolymerization initiator in the inventive photosensitive resin composition should be in the range from 0.1 to 20% by weight based on the total amount of the resinous ingredients including the components (a), (b) and (c).

The component (e) in the inventive photosensitive resin composition is a powdery solid as a filler exemplified by various inorganic powders such as finely divided silica filler, mica flakes, talc, aluminum oxide, aluminum hydroxide, antimony oxide and the like and powders of synthetic resins such as spherical resins, powdery polyimide resins, powdery polyamide resins and the like. Although the amount of the powdery solid in the inventive resin composition should be selected depending on the kind of the powder and the intended application of the resin composition, it is usually in the range from 1 to 70% by weight based on the overall amount of the solid matter in the composition as a rough standard.

It is optional that the inventive photosensitive resin composition is further admixed with various kinds of known additives conventionally used in photosensitive resin compositions including silicone-based and fluorocarbon-based antifoam agents, polymerization inhibitors such as hydroquinone, methyl hydroquinone, hydroquinone monomethyl ether and the like to serve as a gelation inhibitor or stabilizer in storage, coloring agents such as dyes and pigments, and so on.

The heat-resistant photosensitive resin composition of the present invention is prepared usually in the form of a solution by dissolving or dispersing the above described essential and optional ingredients in an organic solvent. Exemplary of suitable organic solvents are etheric solvents such as ethylene glycol monomethyl ether, ethylene glycol monoethyl ether, ethylene glycol monobutyl ether, propylene glycol monomethyl ether, diethylene glycol monomethyl ether and dipropylene glycol monomethyl ether and ketone solvents such as methyl ethyl ketone, methyl isobutyl ketone and cyclohexanone. It is further optional to use a petroleum-based as a diluent in combination with the above mentioned solvents with an object to control the viscosity of the composition. Several commercial products of petroleum-based solvents are suitable for the purpose including, for example, Swazol manufactured by Maruzen Petroleum Co. and Solvesso manufactured by Tonen Petrochemical Co.

When the inventive heat-resistant photosensitive resin composition is used as a solder resist on a printed circuit board, the composition is applied to both surfaces of the circuit board bearing a circuit pattern and provided with through-holes by using a roller coater, curtain-flow coater and the like and dried followed by pattern-wise irradiation with ultraviolet light through a negative photomask and then the resin in the unirradiated areas is removed by dissolving with a weakly alkaline aqueous solution containing sodium carbonate and the like. Thereafter, the thus patterned layer of the photosensitive resin composition is subjected to a heat treatment at a temperature of 100° to 200° C. to effect thermal crosslinking reaction so that the heat resistance of the resist layer is further increased to give a desired heat-resistant solder resist layer.

When the inventive photosensitive resin composition is used as a plating resist on a copper-foiled laminated board, for example, the resin composition is applied to both surfaces of the substrate board by using a roller coater and the like and dried followed by pattern-wise exposure to light through a negative photomask and the resin composition on the unexposed areas is removed by dissolving with a weakly alkaline aqueous solution to form a patterned resist layer prior to the desired plating treatment. The plating bath in this case should desirably be neutral or acidic.

When the inventive photosensitive resin composition is used as an etching resist on a copper-foiled laminated plate, the resin composition is applied to the surface of the copper foil and patterned similarly to the above and then the copper foil exposed bare in the areas from which the resist layer has been removed is subjected to an etching treatment by using an etching solution such as an aqueous solution of iron (III) chloride and the like. The resist layer after the etching treatment can readily be removed by dissolving with a strongly alkaline aqueous solution such as an aqueous solution of sodium hydroxide.

In the following, the heat-resistant photosensitive resin composition of the invention is described in more detail by way of examples, in which the terms of "parts" and "%" always refer to "parts by weight" and "% by weight".

EXAMPLE 1

Into a reaction flask having a separable cover and equipped with a thermometer, stirrer and reflux condenser were introduced 40 parts of methyl methacrylate, 20 parts of styrene, 20 parts of methacrylic acid, 20 parts of N-isobutoxymethyl acrylamide (IBMA, a product by Nitto Riken Kogyo Co.), 60 parts of ethylene glycol monobutyl ether, 40 parts of diethylene glycol monoethyl ether and 2 parts of 2,2'-azobis(2,4-dimethyl valeronitrile (V-65, a product by Wako Junyaku Co.) as a radical polymerization initiator to form a polymerization mixture which was heated at 70° C. to effect the copolymerization reaction. The thus obtained copolymer, which is referred to as the copolymer A hereinbelow, had an acid value of 130 and an average molecular weight of 48,000.

A photosensitive resin composition was prepared by blending 100 parts of the above prepared copolymer A, 3 parts of diethyl thioxanthone (DETX, a product by Nippon Kayaku Co.), 4 parts of 2,2'-dimethoxy-2-phenyl acetophenone (Irgacure 651, a product by Ciba Geigy Co.), 6 parts of a finely divided fumed silica filler (Aerosil #200, a product by Nippon Aerosil Co.), 2 parts of a silicone-based antifoam agent (KS-603, a product by Shin-Etsu Chemical Co.), 30 parts of trimethylol propane triacrylate (a product by Shin-Nakamura Kagaku Co.) and 40 parts of a cresol novolac-type esterified resin (SP-4060, a product by Showa Kobunshi Co.) and thoroughly kneading the mixture on a three-roller mill.

The thus prepared resin composition was applied to a side of a printed circuit board having a through-hole by using a roller coater and then dried by heating at 80° C. for 15 minutes. The other side of the printed circuit board was coated with the resin composition as above and dried by heating at 80° C. for 30 minutes. After cooling the coating layers to room temperature by standing, the photosensitive layers were simultaneously exposed pattern-wise to ultraviolet each in a dose of 400 mJ/cm$^2$ through a negative photomask and then developed by dissolving away the resin composition on the unexposed areas at 30° C. with a 1.5% aqueous solution of sodium carbonate to form a patterned resist layers which were then heated at 140° C. for 60 minutes to effect thermal curing of the resin composition so that the printed circuit board was provided with a patterned solder resist layer.

The circuit board was coated with a rosin-based flux having a pH of 2 to activate the metal-made terminals around the through-hole and then immersed in a bath of molten solder alloy at 260° C. for 1 minute to find no discoloration or blistering of the resist layer on the circuit pattern. The circuit board was further immersed in boiling methylene chloride for 10 minutes with an object to remove the rosin-based flux but no change was noted in the resist layer. The photosensitive resin composition prepared and used here could be stored for a week at 40° C. with no noticeable change in the viscosity.

EXAMPLE 2

Into a reaction flask having a separable cover and equipped with a thermometer, stirrer and reflux condenser were introduced 40 parts of methyl methacrylate, 20 parts of styrene, 20 parts of methacrylic acid, 20 parts of N-n-butoxymethyl acrylamide (NBMA, a product by Nitto Riken Kogyo Co.), 60 parts of ethylene glycol monobutyl ether, 40 parts of diethylene glycol monoethyl ether and 4 parts of 2,2'-azobis(2,4-dimethyl valeronitrile) (V-65, supra) as a radical polymerization initiator to form a polymerization mixture which was heated at 70° C. to effect the copolymerization reaction. The thus obtained copolymer, which is referred to as the copolymer B hereinbelow, had an acid value of at least 130 and an average molecular weight of 30,000.

A uniform photosensitive resin composition was prepared by blending 100 parts of the above obtained copolymer B, 4 parts of benzophenone, 1 part of 4,4'-diethylamino benzophenone, 6 parts of a finely divided fumed silica filler (Aerosil #300, a product by Nippon Aerosil Co.), 2 parts of a silicone-based antifoam agent (KS-603, a product by Shin-Etsu Chemical Co.), 25 parts of pentaerithritol triacrylate (A-TMM-3L, a product by Shin-Nakamura Kagaku Co.) and 45 parts of a cresol novolac-type esterified resin (SP-4060, a product by Showa Kobunshi Co.) and thoroughly kneading the mixture in a ball mill.

The thus prepared resin composition was applied to a side of a printed circuit board having a though-hole by using a roller coater and dried by heating at 80° C. for 15 minutes and then the other side was coated in the same manner followed by drying by heating at 80° C. for 30 minutes. After cooling to room temperature, the thus formed resist layers were simultaneously exposed pattern-wise to ultraviolet light each in a dose of 500 mJ/cm$^2$ through a negative photomask and developed by dissolving away the resin composition on the unexposed areas taking 100 seconds with a 1.5% aqueous solution of sodium carbonate at 30° C. followed by a heat treatment at 150° C. for 60 minutes to give a printed circuit board having patterned solder resist layers formed on both surfaces.

The circuit board was coated with a rosin-based flux having a pH of 2 to activate the metal-made terminals around the through-hole and then immersed in a bath of molten solder alloy at 260° C. for 1 minute to find no discoloration or blistering of the resist layer on the circuit pattern. The circuit board was further immersed in boiling methylene chloride for 10 minutes with an object to remove the rosin-based flux but no change was noted in the resist layer. The resin composition was kept at 40° C. for 1 week in a hermetically sealed polyethylene-made container with no change in the viscosity.

EXAMPLE 3

Into a reaction flask having a separable cover and equipped with a thermometer, stirrer and reflux condenser were introduced 40 parts of methyl methacrylate, 20 parts of styrene, 20 parts of methacrylic acid, 20 parts of N-n-butoxyethyl acrylamide, 60 parts of ethylene glycol monobutyl ether, 40 parts of ethylene glycol monoethyl ether and 3 parts of 2,2'-azobis(2,4-dimethyl valeronitrile) (V-65, a product by Wako Junyaku Co.) as a radical polymerization initiator to form a polymerization mixture which was heated at 70° C. to effect the copolymerization reaction The thus obtained copolymer, which is referred to as the copolymer C hereinbelow, had an acid value of 130 and an average molecular weight of 38,000.

On the other hand, an esterified resin, referred to as the esterified resin A hereinbelow, was prepared by admixing 1800 parts of a phenol novolac-type epoxy resin having a softening point of 60° to 70° C. and an epoxy equivalent of 170 to 180 (YDPM 638, a product by Toto Kasei Kogyo Co.) with 730 parts of acrylic acid, 0.6 part of methyl hydroquinone and 2.9 parts of triethyl amine and heating the mixture at 100° C. for 15 hours.

A uniform photosensitive resin composition was prepared by blending 100 parts of the copolymer C, 2 parts of diethyl thioxanthone (DETX, a product by Nippon Kayaku Co.), 4 parts of ethyl dimethylamino benzoate (EPA, a product by Nippon Kayaku Co.), 6 parts of a finely divided fumed silica filler (Aerosil #380, a product by Nippon Aerosil Co.), 2 parts of a silicone-based antifoam agent (KS-603, a product by Shin-Etsu Chemical Co.), 45 parts of trimethylol propane propylene oxide triacrylate (M-320, a product by Toa Gosei Kagaku Co.) of the formula $C_2H_5C[CH_2O(C_3H_6O)_2$-$COCH=CH_2]_3$, 20 parts of a cresol novolac-type esterified resin (SP-406 u, a product by Showa Kobunshi Co.) and 20 parts of the esterified resin A and thoroughly kneading the mixture on a three-roller mill.

The thus prepared resin composition was applied through a polyester filament-made screen of 150 mesh fineness to a side of a printed circuit board provided with a circuit pattern formed thereon in advance and having a through-hole and dried by heating at 80° C. for 15 minutes. The other side of the circuit board was coated in the same manner with the resin composition which was dried by heating at 80° C. for 30 minutes. After cooling to room temperature, the thus formed resist layers were simultaneously exposed pattern-wise to ultraviolet light each in a dose of 600 mJ/cm$^2$ through a negative photomask and developed by dissolving away the resin composition on the unexposed areas taking 100 seconds with a 1.5% aqueous solution of sodium carbonate at 30° C. followed by a heat curing treatment at 140° C. for 60 minutes to give a printed circuit board having a patterned solder resist layers formed on both surfaces.

The circuit board was coated with a rosin-based flux having a pH of 2 to activate the metal-made terminals around the through-hole and then immersed in a bath of molten solder alloy at 260° C. for 1 minute to find no discoloration or blistering of the resist layer on the circuit pattern. The circuit board was further immersed in boiling methylene chloride for 10 minutes with an object to remove the rosin-based flux but no change was noted in the resist layer. The resin composition was kept at 40° C. for 1 week in a hermetically sealed polyethylene-made container with no change in the viscosity.

EXAMPLE 4

A printed circuit board was coated with the photosensitive resin composition prepared in Example 1 and dried followed by pattern-wise exposure to light, development and thermal curing treatment to give a printed circuit board having a patterned solder resist layer formed thereon in the same manner as in Example 1.

The printed circuit board was then subjected to a gold-plating treatment by dipping for 10 minutes in an acidic bath for gold plating having a pH of 5 at a bath temperature of 50° C. to give a quite satisfactory result of gold plating without blistering of the resist layer and plating behind the resist layer.

COMPARATIVE EXAMPLE 1

A uniform photosensitive resin composition was prepared by thoroughly blending, in a ball mill, a mixture composed of 100 parts of the copolymer A prepared in Example 1, 3 parts of diethyl thioxanthone (DETX, a product by Nippon Kayaku Co.), 4 parts of 2 methyl-1-[4-(methylthio)phenyl]-2-morpholino-1-propanone (Irgacure 907, a product by Ciba Geigy Co.), 6 parts of a finely divided fumed silica filler (Aerosil #380, a product by Nippon Aerosil Co.), 30 parts of pentaerithritol triacrylate, 40 parts of a phenol novolac-type epoxy resin (YDPN 638, a product by Toto Kasei Kogyo Co.) and 2 parts of an epoxy curing agent (2MA-OK, a product by Shikoku Kasei Kogyo Co.). The thus prepared resin composition was applied by using a roller coater to a side of a printed circuit board provided with a circuit pattern formed thereon and a through-hole and dried by heating at 80° C. for 15 minutes. The other side of the circuit board was coated in the same manner with the resin composition which was dried by heating at 80° C. for 20 minutes. After cooling to room temperature, the layers of the resin composition were simultaneously exposed pattern-wise to ultraviolet light each in a dose of 400 mJ/cm$^2$ through a negative photomask and the resin composition in the unexposed areas was removed by dissolving away with a 1.5% aqueous solution of sodium carbonate. The result was that no satisfactory printed circuit board with patterned resist layers could be obtained due to white foaming and swelling of the resin composition in the exposed areas.

COMPARATIVE EXAMPLE 2

Into a reaction flask having a separable cover and equipped with a thermometer, stirrer and reflux condenser were introduced 60 parts of methyl methacrylate, 20 parts of isobutyl methacrylate, 20 parts of methacrylic acid, 60 parts of ethylene glycol monomethyl ether, 40 parts of diethylene glycol monoethyl ether and 2 parts of 2,2'-azobis(2,4-dimethyl valeronitrile) (V-65, a product by Wako Junyaku Co.) as a radical polymerization initiator to form a polymerization mixture to effect the copolymerization reaction by heating at 70° C. The thus obtained copolymer, which is referred to as the copolymer D hereinbelow, had an acid value of 130 and an average molecular weight of 45,000.

A uniform photosensitive resin composition was prepared by thoroughly kneading, on a three-roller mill, a blend composed of 100 parts of the above obtained copolymer D, 3 parts of diethyl thioxanthone (DETX, a product by Nippon Kayaku Co.), 4 parts of 2,2-dimethoxy-2-phenyl acetophenone (Irgacure 651, a product by Ciba Geigy Co.), 6 parts of a finely divided fumed silica filler (Aerosil #380, a product by Nippon Aerosil Co.), 2 parts of a silicone-based antifoam agent (KS-603, a product by Shin-Etsu Chemical Co.), 30 parts of tetramethylol methane triacrylate (a product by Shin-Nakamura Kagaku Co.) and 40 parts of a cresol novolac-type esterified resin (SP-4060, a product by Showa Kobunshi Co.).

The thus prepared resin composition was applied through a polyester filament-made screen of 150 mesh fineness to a side of a printed circuit board provided with a circuit pattern formed thereon in advance and having a through-hole and dried by heating at 80° C. for 10 minutes. The other side of the circuit board was coated in the same manner with the resin composition which was dried by heating at 80° C. for 20 minutes. After cooling to room temperature, the thus formed resist layers were simultaneously exposed pattern-wise to ultraviolet light each in a dose of 400 mJ/cm$^2$ through a negative photomask and developed by dissolving away the resin composition on the unexposed areas taking 100 seconds with a 1.5% aqueous solution of sodium carbonate at 30° C. followed by a heat-curing treatment at 140° C. for 60 minutes to give a printed circuit board having patterned solder resist layers formed on both surfaces.

The circuit board was coated with a rosin based flux having a pH of 2 to activate the metal-made terminals around the through-hole and then immersed in a bath of molten solder alloy at 260° C. for 1 minute to find that the solder resist layer on the circuit pattern had fallen off.

EXAMPLE 5

A uniform photosensitive resin composition was prepared by thoroughly kneading, on a three-roller mill, a blend composed of 100 parts of the copolymer A prepared in Example 1, 3 parts of diethyl thioxanthone (DETX, a product by Nippon Kayaku Co.), 4 parts of 2,2-dimethoxy-2-phenyl acetophenone (Irgacure 651, a product by Ciba Geigy Co.), 10 parts of a finely divided fumed silica filler (Aerosil #300, a product by Nippon Aerosil Co.), 60 parts of talc (P-4, a product by Nippon Talc Co.), 2 parts of a silicone-based antifoam agent (KS-603, a product by Shin-Etsu Chemical Co.), 60 parts of a phenol novolac-type epoxy acrylate polymer having carboxyl groups (SP-4300-IX, a product by Showa Kobunshi Co.), 30 parts of tri(methoxymethyl)-melamine trimethoxyethyl acrylate (Nicalac MX-302, a product by Sanwa Chemical Co.), 20 parts of trimethylol propane triacrylate, 20 parts of pentaerithritol tetraacrylate and 40 parts of a cresol novolac-type esterified resin (SP-4060, a product by Showa Kobunshi Co.).

The thus prepared resin composition was applied through a polyester filament-made screen of 150 mesh fineness to a side of a printed circuit board provided with a circuit pattern formed thereon in advance and having a through-hole and dried by heating at 80° C. for 15 minutes. The other side of the circuit board was coated in the same manner with the resin composition which was dried by heating at 80° C. for 30 minutes. After cooling to room temperature, the thus formed resist layers were simultaneously exposed pattern-wise to ultraviolet light each in a dose of 600 mJ/cm$^2$ through a negative photomask and developed by dissolving away the resin composition on the unexposed areas taking 80 seconds with a 1.0% aqueous solution of sodium carbonate at 30° C. followed by a heat-curing treatment at 140° C. for 60 minutes to give a printed circuit board having patterned solder resist layers formed on both surfaces.

The circuit board was coated with a rosin-based flux having a pH of 2 to activate the metal-made terminals around the through-hole and then immersed in a bath of molten solder alloy at 260° C. for 1 minute to find no discoloration and blistering of the resist layer on the circuit pattern. Further, the circuit board was immersed for 10 minutes in boiling methylene chloride with an object to remove the above mentioned rosin-based flux to find absolutely no changes in the appearance. Thereafter, the circuit board was immersed for 10 minutes in boiling ethylene glycol monoethyl ether also to find absolutely no changes in the appearance.

EXAMPLE 6

A uniform photosensitive resin composition was prepared by thoroughly kneading, on a three-roller mill, a blend composed of 100 parts of the copolymer C obtained in Example 3, 3 parts of diethyl thioxanthone (DETX, a product by Nippon Kayaku Co.), 4 parts of 2,2-dimethoxy-2-phenyl acetophenone (Irgacure 651, a product by Ciba Geigy Co.), 10 parts of a finely divided fumed silica filler (Aerosil #380, a product by Nippon Aerosil Co.), 50 parts of barium sulfate, 2 parts of a silicone-based antifoam agent (KS-603, a product by Shin-Etsu Chemical Co.), 60 parts of a phenol novolac-type epoxy acrylate polymer having carboxyl groups (SP-4300-IX, a product by Showa Kobunshi Co.), 40 parts of tri(methoxymethyl)melamine trimethoxyethyl acrylate (Nicalac MX-302, a product by Sanwa Chemical Co.), 30 parts of trimethylol propane triacrylate, 20 parts of dipentaerithritol pentaacrylate, 40 parts of a cresol novolac-type esterified resin (SP-4-60, a product by Showa Kobunshi Co.) and 1 part of cyanine green.

The thus prepared resin composition was applied through a polyester filament-made screen of 150 mesh fineness to a side of a printed circuit board provided with a circuit pattern formed thereon in advance and having a through-hole and dried by heating at 80° C. for 15 minutes. The other side of the circuit board was coated in the same manner with the resin composition which was dried by heating at 80° C. for 30 minutes. After cooling to room temperature, the thus formed resist layers were simultaneously exposed pattern-wise to ultraviolet light each in a dose of 600 mJ/cm$^2$ through a negative photomask and developed by dissolving away the resin composition on the unexposed areas taking 80 seconds with a 1.0% aqueous solution of sodium carbonate at 30° C. followed by a heat-curing treatment at 140° C. for 60 minutes to give a printed circuit board having patterned solder resist layers formed on both surfaces.

The circuit board was coated with a rosin-based flux having a pH of 2 to activate the metal-made terminals around the through-hole and then immersed in a bath of molten solder alloy at 260° C. for 1 minute to find no discoloration and blistering of the resist layer on the circuit pattern. Further, the circuit board was immersed for 10 minutes in boiling methylene chloride with an object to remove the above mentioned rosin-based flux to find absolutely no change in the appearance.

EXAMPLE 7

The photosensitive resin composition prepared in Example 2 was uniformly applied to a copper-foiled laminated board over the whole surface by using a roller coater and dried by heating at 80° C. for 30 minutes. After cooling to room temperature, the coating layer was exposed pattern-wise to ultraviolet light in a dose of 400 mJ/cm$^2$ through a negative photomask and then developed by dissolving away the resin composition in the unexposed areas taking 60 seconds with a 1.0% aqueous solution of sodium carbonate at 30° C. to give a laminated board having a patterned resist layer formed thereon.

The laminated board was then subjected to electrolytic plating in a plating bath containing copper sulfate to form a plating layer of copper having a thickness of 20 μm. The results were that a very sharply patterned plating layer was obtained without going behind the resist layer.

EXAMPLE 8

A copper-foiled laminated board was coated with the photosensitive resin composition prepared in Example 1 through a screen of polyester filaments having a fineness of 150 mesh and dried by heating at 80° C. for 30 minutes. After cooling to room temperature, the coating layer on the laminated board was exposed patternwise to ultraviolet light in a dose of 500 mJ/cm$^2$ through a negative photomask and then developed by dissolving away the resin composition in the unexposed areas taking 60 seconds with a 1.0% aqueous solution of sodium carbonate at 30° C. to give a laminated board having a patterned resist layer formed thereon.

Thereafter, the copper foil exposed bare on the laminated board was removed by etching using an aqueous solution of iron (III) chloride. After completion of the etching treatment, the patterned resist layer was dissolved away with a 1.0% aqueous solution of sodium hydroxide at 40° C. The thus obtained circuit pattern of copper foil had very high fidelity to the pattern on the negative photomask.

What is claimed is:

1. A heat resistant photosensitive resin composition which consists essentially of:
    (a) a copolymer obtained by the copolymerization of a monomer mixture comprising from 10 to 30% by weight of an ethylenically unsaturated amide compound represented by the general formula

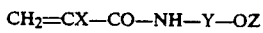
    $$CH_2=CX-CO-NH-Y-OZ$$

in which x is a hydrogen atom or methyl group, Y is an alkylene group having 1 to 4 carbon atoms and Z is an alkyl group having 1 to 4 carbon atoms or a benzyl group as a first essential monomer; from 10 to 30% by weight of an ethylenically unsaturated compound having at least one carboxyl group in a molecule as a second essential monomer; and 40 to 80% by weight of a third essential monomer of an ethylenically unsaturated compound selected from the group consisting of styrene, α-methyl styrene, methyl acrylate, methyl methacrylate, butyl acrylate, butyl methacrylate, hydroxymethyl acrylate, hydroxymethyl methacrylate, hydroxypropyl acrylate and hydroxypropyl methacrylate;
    (b) an esterified resin which is a reaction product of a novolac-type epoxy resin and an ethylenically unsaturated carboxylic acid in an amount of above 0.8 to 1.1 equivalents relative to the epoxy groups in the novolac-type epoxy resin to esterify said resin so that the resultant product contains essentially no unreacted epoxy groups;
    (c) a photopolymerizable monomer;
    (d) a photopolymerization initiator; and
    (e) a solid powder as a filler.

2. The heat-resistant photosensitive resin composition as claimed in claim 1 wherein the first monomer for the component (a) is selected from the group consisting of N-methoxymethyl acrylamide, N-methoxymethyl methacrylamide, N-ethoxymethyl acrylamide, N-ethoxymethyl methacrylamide, N-propoxymethyl acrylamide, N-propoxymethyl methacrylamide, N-n-butoxymethyl acrylamide, N-n-butoxymethyl methacrylamide, N-isobutoxymethyl acrylamide, N-isobutoxymethyl methacrylamide, N-benzyloxymethyl acrylamide, N-benzyloxymethyl methacrylamide, N-n-butoxyethyl acrylamide, N-n-butoxyethyl methacrylamide, N-isobutoxyethyl acrylamide and N-isobutoxyethyl methacrylamide.

3. The heat-resistant photosensitive resin composition as claimed in claim 1 wherein the second monomer for the component (a) is acrylic acid or methacrylic acid.

4. The heat-resistant photosensitive resin composition as claimed in claim 1 wherein the ethylenically unsaturated carboxylic acid for the component (b) is selected from the group consisting of acrylic acid, methacrylic acid, crotonic acid, monomethyl maleate, monopropyl maleate, monobutyl maleate and sorbic acid.

5. The heat-resistant photosensitive resin composition as claimed in claim 1 wherein the photopolymerizable monomer as the component (c) is selected from the group consisting of methyl acrylate, methyl methacrylate, 2-hydroxyethyl acrylate, 2-hydroxyethyl methacrylate, 2-hydroxypropyl acrylate, 2-hydroxypropyl methacrylate, 1,6-hexanediol diacrylate, trimethylol propane triacrylate, trimethylol propane trimethacrylate, trimethylol propane diacrylate, trimethylol propane dimethacrylate, tetramethylol propane tetraacrylate, tetramethylol propane tetramethacrylate, pentaerithritol triacrylate, pentaerithritol trimethacrylate, dipentaerithritol pentaacrylate, dipentaerithritol pentamethacrylate, 1,1,1-tri(acryloxypropoxypropoxymethyl) propane, melamine acrylates and carboxyl-containing esterified resins.

6. The heat-resistant photosensitive resin composition as claimed in claim 1 wherein the amount of the esterified resin as the component (b) is in the range from 20 to 200 parts by weight per 100 parts by weight of the copolymer as the component (a).

7. The heat-resistant photosensitive resin composition claimed in claim 1 wherein the amount of the photopolymerizable monomer as the component (c) is in the range from 25 to 200 parts by weight per 100 parts by weight of the copolymer as the component (a).

8. The heat-resistant photosensitive resin composition as claimed in claim 1 wherein the photopolymerization initiator as the component (d) is selected from the group consisting of benzophenone, 4,4'-dimethylamino benzophenone, 4,4'-diethylamino benzophenone, 2-ethyl anthraquinone, tert-butyl anthraquinone, benzoin ethyl ether, benzoin propyl ether, 2,2-dimethoxy-2-phenyl acetophenone, 2,2-diethoxy acetophenone, 2-chloro thioxanthone, diethyl thioxanthone, 2-hydroxy-2-methyl propiophenone, 4'-iso- propyl-2-hydroxy-2-methyl propiophenone and 2-methyl-1-[4-(methylthio)-phenyl]-2-morpholino-1-propanone 9. The heat-resistant photosensitive resin composition as claimed in claim 1 wherein the amount of the photopolymerization initiator as the component (d) is in the range from 0.1 to 20% by weight based on the total amount of the copolymer as the component (a), the esterified resin as the component (b) and the photopolymerizable monomer as the component (c).

10. The heat-resistant photosensitive resin composition as claimed in claim 1 wherein the solid powder as the component (e) is selected from the group consisting of finely divided silica filler, mica flakes, talc, aluminum oxide, aluminum hydroxide, antimony oxide, spherical benzoquanidine resin, powdery polyimide resin and powdery polyamide resin.

11. The heat-resistant photosensitive resin composition as claimed in claim 1 which further consists essentially of a solvent selected from the group consisting of ethylene glycol monomethyl ether, ethylene glycol monoethyl ether, ethylene glycol monobutyl ether, propylene glycol monomethyl ether, diethylene glycol monomethyl ether, dipropylene glycol monomethyl ether, methyl ethyl ketone, methyl isobutyl ketone and cyclohexanone.

12. A heat resistant photosensitive composition consisting essentially of:
(a) a copolymer obtained by the copolymerization of a monomer mixture of 10 to 30% by weight of a first monomer selected from the group consisting of N-methoxymethy acrylamide, N-methoxymethyl methacrylamide, N-ethoxymethyl acrylamide, N-ethoxymethyl methacrylamide, N-propoxymethyl acrylamide, N-propoxymethyl methacrylamide, N-n-butoxymethyl acrylamide, N-n-butoxymethyl methacrylamide, N-isobutoxymethyl acrylamide, N-isobutoxymethyl methacrylamide, N-benzyloxymethyl acrylamide, N-benzyloxymethyl methacrylamide, N-n-butoxyethyl acrylamide, N-n-butoxyethyl methacrylamide, N-isobutoxyethyl acrylamide and N-isobutoxyethyl methacrylamide;
10 to 30% by weight of a second monomer of an ethylenically unsaturated compound having at least one carboxyl group; and
40 to 80% by weight of a third monomer selected from the group consisting of styrene, α-methyl styrene, methyl acrylate, methyl methacrylate, butyl acrylate, butyl methacrylate, hydroxymethyl acrylate, hydroxymethyl methacrylate, hydroxypropyl acrylate and hydroxypropyl methacrylate;
(b) an esterified resin which is esterified so that the resultant product contains essentially no unreacted epoxy groups, wherein said esterified resin is a reaction product of a novolac-type epoxy-resin and an ethylenically unsaturated carboxylic acid in an amount of above 0.8 to 1.1 equivalents relative to the epoxy groups in the novolac-type epoxy resin;
(c) a photopolymerizable monomer; and
(d) a photopolymerizable initiator, wherein said composition is developable with an aqueous alkaline solution.

13. The heat-resistant photosensitive resin composition as claimed in claim 12 which further consists essentially of a solid powder as a filler.

14. The heat-resistant photosensitive resin composition as claimed in claim 12 wherein the second monomer is acrylic acid or methacrylic acid.

15. The heat-resistant photosensitive resin composition as claimed in claim 12 which further consist essentially of a solvent.

16. A heat-resistant photosensitive composition consisting essentially of:
(a) 100 parts by weight of a copolymer obtained by the copolymerization of a monomer mixture of 10 to 30% by weight of a first monomer selected from the group consisting of N-methoxymethyl acrylamide, N-methoxymethyl methacrylamide, N-ethoxymethyl acrylamide, N-ethoxymethyl methacrylamide, N-propoxymethyl acrylamide, N-propoxymethyl methacrylamide, N-n-butoxymethyl acrylamide, N-n-butoxymethyl methacrylamide, N-isobutoxymethyl acrylamide, N-isobutoxymethyl methacrylamide, N-benzyloxymethyl acrylamide, N-benzyloxymethyl methacrylamide, N-n-butoxyethyl acrylamide, N-n-butoxyethyl methacrylamide, N-isobutoxyethyl acrylamide and N-isobutoxyethyl methacrylamide; 10 to 30% by weight of a second monomer of an ethylenically unsaturated compound having at least one carboxyl group; and 40 to 80% by weight of a third monomer selected from the group consisting of styrene, α-methyl styrene, methyl acrylate, methyl methacrylate, butyl acrylate, butyl methacrylate, hydroxymethyl acrylate, hydroxymethyl methacrylate, hydroxypropyl acrylate, and hydroxypropyl methacrylate;
(b) between 20 and 200 parts by weight of an esterified resin which is esterified so that the resultant product contains almost no unreacted epoxy groups, wherein said esterified resin is a reaction product of a novolac-type epoxy resin and an ethylenically unsaturated carboxylic acid in an amount of above 0.8 to 1.1 equivalents relative to the epoxy groups in the novolac-type epoxy resin;
(c) between 25 and 200 parts by weight of a photopolymerizable monomer; and
(d) from 0.1 to 20% by weight based on the total weight of (a) (b) and (c) of a photopolymerizable initiator, wherein said composition is developable with an aqueous alkaline solution.

17. The heat-resistant photosensitive resin composition as claimed in claim 16 which further consists essentially of solvent.

18. The heat-resistant photosensitive resin composition as claimed in claim 16 herein the solvent is selected from the group consisting of ethylene glycol monomethyl ether, ethylene glycol monoethyl ether, ethylene glycol monobutyl ether, propylene glycol monomethyl ether, diethylene glycol monomethyl ether, dipropylene glycol monomethyl ether, methyl ethyl ketone, methyl isobutyl ketone and cyclohexanone.

19. A heat resistant photosensitive resin composition which consists essentially of:
(a) a copolymer obtained by the copolymerization of a monomer mixture comprising from 10 to 30% by weight of an ethylenically unsaturated amide compound represented by the general formula

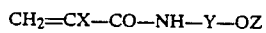

in which X is a hydrogen atom or methyl group, Y is an alkylene group having 1 to 4 carbon atoms and Z is an alkyl group having 1 to 4 carbon atoms or a benzyl group as a first essential monomer; from 10 to 30% by weight of an ethylenically unsaturated compound having at least one carboxyl group in a molecule as a second essential monomer; and 40 to 80% by weight of a third essential monomer of an ethylenically unsaturated compound selected from the group consisting of styrene, α-methyl styrene, methyl acrylate, methyl methacrylate, butyl acrylate, butyl methacrylate, hydroxymethyl acrylate, hydroxymethyl methacrylate, hydroxypropyl acrylate and hydroxypropyl methacrylate;
(b) an esterified resin which is a reaction product of a novolac-type epoxy resin and an ethylenically unsaturated carboxylic acid in an amount of above 0.8 to 1.1 equivalents relative to the epoxy groups in the novolac-type epoxy resin to esterify said resin so that the resultant product contains essentially no unreacted epoxy groups;
(c) a photopolymerizable monomer;
(d) a photopolymerization initiator; and
(e) a solid powder as a filler in an amount in the range from 1 to 70% by weight based on the total amount of the copolymer as the component (a), the esterified resin as the component (b) and the photpolymerizable monomer as the component (c).

20. A heat-resistant photosensitive composition consisting essentially of:
(a) 100 parts by weight of a copolymer obtained by the copolymerization of a monomer mixture of 10 to 30% by weight of a first monomer selected from the group consisting of N-methoxymethyl acrylamide, N-methoxymethyl methacrylamide, N-ethoxymethyl acrylamide, N-ethoxymethyl methacrylamide, N-propoxymethyl acrylamide, N-propoxymethyl methacrylamide, N-n-butoxymethyl acrylamide, N-n-butoxymethyl methacrylamide, N-isobutoxymethyl acrylamide, N-isobutoxymethyl methacrylamide, N-benzyloxymethyl acrylamide, N-benzyloxymethyl methacrylamide, N-n-butoxyethyl acrylamide, N-n-butoxyethyl methacrylamide, N-isobutoxyethyl acrylamide and N-isobutoxyethyl methacrylamide; 10 to 30% by weight of a second monomer of an ethylenically unsaturated compound having at least one carboxyl group; and 40 to 80% by weight of a third monomer selected from the group consisting of styrene, α-methyl styrene, methyl acrylate, methyl methacrylate, butyl acrylate, butyl methacrylate, hydroxymethyl acrylate, hydroxymethyl methacrylate, hydroxypropyl acrylate, and hyroxypropyl methacrylate;
(b) between 20 and 200 parts by weight of an esterified resin which is esterified so that the resultant product contains almost no unreacted epoxy groups, wherein said esterified resin is a reaction product of a nonvolac-type epoxy resin and an ethylenically unsaturated carboxylic acid in an amount of about 0.8 to 1.1 equivalents relative to the epoxy groups in the nonvolac-type epoxy resin;
(c) between 25 and 200 parts by weight of a photopolymerizable monomer;
(d) from 0.1 to 20% by weight based on the total weight of (a) (b) and (c) of a photopolymerizable initiator; and
(e) between 1 and 70% by weight based on the total weight of (a), (b) and (c) of a solid powder as a filler; wherein said composition is developable with an aqueous alkaline solution.

21. The heat-resistant photosensitive resin composition as claimed in claim 19 wherein the solid powder is selected from the group consisting of finely divided silica filler, mica flakes, talc, aluminum oxide, aluminum hydroxide, antimony oxide, spherical benzoquanidine resin, powdery polyamide resin and powdery polyamide resin.

* * * * *